United States Patent [19]
Esguerra

[11] Patent Number: 5,705,861
[45] Date of Patent: Jan. 6, 1998

[54] MAGNETIC FIELD PULSE GENERATOR

[75] Inventor: Mauricio Esguerra, Unterhaching, Germany

[73] Assignee: Siemens Matsushita Components GmbH & Co. KG, Munich, Germany

[21] Appl. No.: 573,729

[22] Filed: Dec. 18, 1995

Related U.S. Application Data

[63] Continuation of PCT/DE94/00700, Jun. 20, 1994.

[51] Int. Cl.⁶ .................................................. H04B 15/00
[52] U.S. Cl. .................... 307/106; 307/104; 307/101; 333/12; 361/139
[58] Field of Search ..................... 307/89–91, 105, 307/106, 108, 1, 101, 104; 333/12; 324/320, 313, 200, 219, 236, 207.12, 226, 253, 260, 262, 263; 174/35 R, 35 CE, 35 MS; 361/204, 139

[56] References Cited

U.S. PATENT DOCUMENTS

| | | | |
|---|---|---|---|
| 3,397,347 | 8/1968 | Hoeppel | 361/139 |
| 3,617,809 | 11/1971 | Penn | 361/45 |
| 3,742,477 | 6/1973 | Enabnit | 198/810.02 |
| 4,199,003 | 4/1980 | Goldsmith | 137/467.5 |
| 4,587,486 | 5/1986 | Soyck | 324/236 |
| 4,612,455 | 9/1986 | Weiner et al. | 307/106 |
| 5,089,716 | 2/1992 | Wallis et al. | 307/101 |
| 5,252,919 | 10/1993 | Uemura | 324/207.25 |
| 5,465,012 | 11/1995 | Dunnam | 307/91 |

FOREIGN PATENT DOCUMENTS

| | | |
|---|---|---|
| 3619238 | 3/1987 | Germany . |
| 3505765 | 6/1987 | Germany . |
| 86/07637 | 12/1986 | WIPO . |

*Primary Examiner*—Richard T. Elms
*Assistant Examiner*—Peter Ganjian
*Attorney, Agent, or Firm*—Herbert L. Lerner; Laurence A. Greenberg

[57] ABSTRACT

A magnetic field pulse generators has an electrical coil and a magnetizable element being inductively coupled thereto, for together radiating a magnetic field into an external space. In order to switch off the magnetic field in the external space, the magnetizable element can be driven to saturation by a pulsed current in the coil at which the material of the coil core has not yet reached saturation.

5 Claims, 1 Drawing Sheet

MAGNETIC FIELD PULSE GENERATOR

CROSS-REFERENCE TO RELATED APPLICATION:

This application is a Continuation of International Application Ser. No. PCT/DE94/00700, filed Jun. 20, 1994.

BACKGROUND OF THE INVENTION

1. Field of the Invention

The present invention relates to a magnetic field pulse generator having an electrical coil and a magnetizable element being inductively coupled thereto, for together radiating a magnetic field into an external space, the magnetic field in the external space being switchable on and off by electrically switching over the magnetizable element from an unsaturated to a saturated state.

Magnetic field pulse generators of the above-described generic type are known, for example, from German Patent DE 35 05 765 C2. That publication refers to a magnetic field pulse generator of the type under discussion as a test device for monitoring the functioning of an inductive proximity switch. That test device has a secondary coil through which flows a sensor field of a resonant circuit coil of the inductive proximity switch, as a result of which the test device can be used to change over the resonant circuit of the inductive proximity switch from its actual state to the respective opposite state regarding the damping. In this case, the secondary coil keeps the resonant circuit in the undamped state when the coil connections are open, and in the damped state when a test resistor is connected to the coil connections. The secondary coil is seated on its own secondary core, which completely shields the sensor field of the resonant circuit coil from a metal release for the inductive proximity switch when the coil connections are open and when the secondary coil is closed by the test resistor, and builds up a secondary sensor field for the metal release only when the secondary coil is short-circuited. A test device of that type may be referred to as a magnetic field pulse generator because the sensor field acting in the external space is switched on and off, that is to say it is unmasked and masked, as a result of currents of differing magnitude in the secondary coil. A magnetic field pulse generator of that type is disadvantageous in so far as two coils together forming a transformer, namely the resonant circuit coil of the inductive proximity switch and the secondary coil of the test device, are necessary. Therefore, the structure of the magnetic circuit of the magnetic shield becomes relatively bulky.

SUMMARY OF THE INVENTION:

It is accordingly an object of the invention to provide a magnetic field pulse generator, which overcomes the hereinafore-mentioned disadvantages of the heretofore-known devices of this general type and which has a relatively compact structure.

With the foregoing and other objects in view there is provided, in accordance with the invention, a magnetic field pulse generator, comprising an electrical coil having a core formed of a material; a magnetizable element being inductively coupled to the electrical coil, the magnetizable element being formed of a ferromagnetic material reaching saturation at a magnetic induction being small in relation to an induction necessary to saturate the material of the core; the magnetizable element and the electrical coil together radiating a magnetic field into an external space, the magnetic field in the external space being switched on and off by electrically switching over the magnetizable element from an unsaturated to a saturated state; and a pulse voltage source being coupled to the coil for superimposing a pulsed current on a current generating the magnetic field, the pulsed current being sufficient to generate a magnetic induction at which the magnetizable element reaches saturation.

The field pulse generator according to the invention has a compact structure because it has only a single coil and the unmasking and masking of the magnetic field acting in the external space is provide by a two-part but physically compact magnetic circuit having various materials of differing reversible permeability.

In accordance with another feature of the invention, the coil has an open side, the core of the coil is a half-shell-type core, and the magnetizable element is placed onto the open side of and closes off the coil.

In accordance with a further feature of the invention, the coil has a center, the magnetizable element has a side facing the open side of the coil, the side of the magnetizable element has a conical shape with a vertex lying in the center of the coil, and the open side of the coil is matched to the conical shape of the magnetizable element.

In accordance with an added feature of the invention, there is provided an electrically conductive, metallic carrier housing into which the electrical coil and the magnetizable element fit flush.

In accordance with a concomitant feature of the invention, magnetic field pulse generator is used in an inductive proximity switch.

Other features which are considered as characteristic for the invention are set forth in the appended claims.

Although the invention is illustrated and described herein as embodied in a magnetic field pulse generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
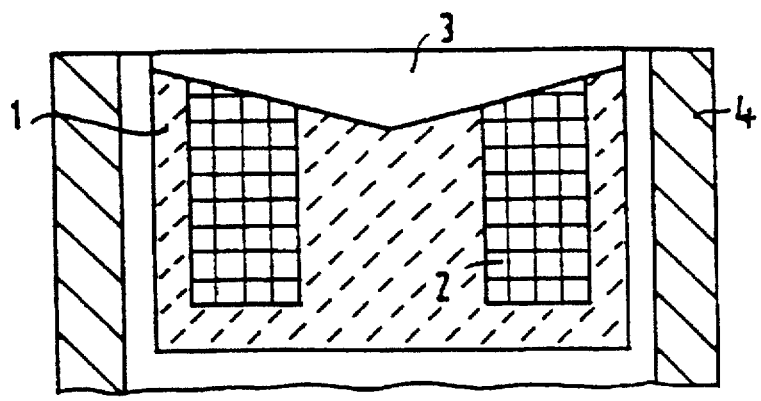
FIG. 1 is a fragmentary, diagrammatic, longitudinal-sectional view of a structure of a magnetic field pulse generator according to the invention.

DESCRIPTION OF THE PREFERRED EMBODIMENTS:

Referring now to the figures of the drawing in detail and first, particularly, to FIG. 1 thereof, there is seen an embodiment of a magnetic field pulse generator in which a half-shell-type core 1 carries a coil winding 2. A magnetizable element 3 is placed onto an outer surface of a coil formed by the half-shell-type core 1 and the winding 2. The electrical coil formed by the half-shell-type core 1 and the winding 2 as well as the magnetizable element 3 are fitted flush into a metallic housing 4.

Figure 3:
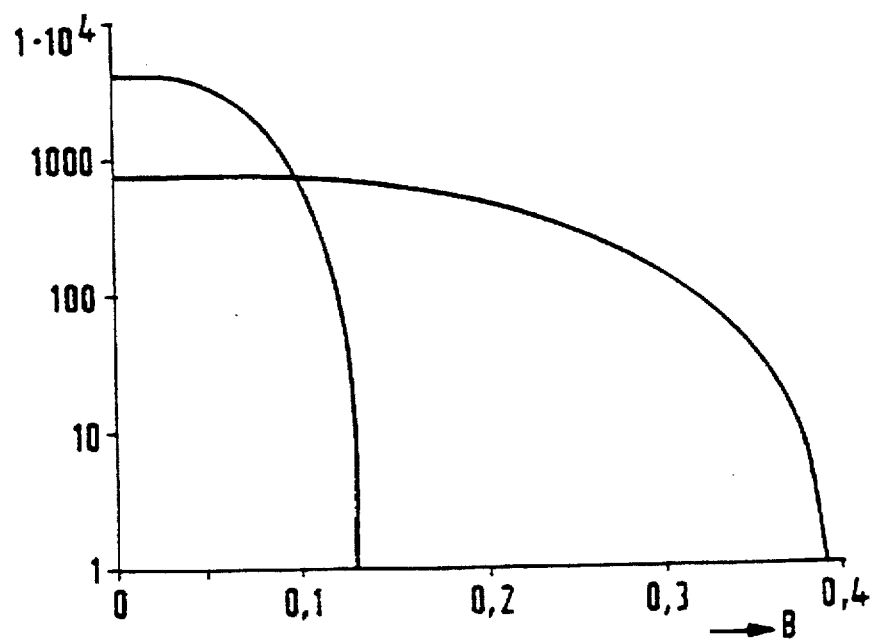
FIG. 3 is a diagram showing a characteristic of reversible permeability as a function of magnetic induction for two different magnetic materials in a magnetic field pulse generator according to FIG. 1.

An essential feature of the magnetic field pulse generator according to the invention is that the magnetizable element 3 is formed by a ferromagnetic material which reaches saturation at a magnetic induction that is small in relation an induction which is necessary to saturate the material the core 1 of the coil 1, 2. This fact regarding a dependence of a reversible permeability μrel on a magnetic induction B is illustrated in the diagram according to FIG. 3 for the materials of the coil core 1 and of the magnetizable 3 according to FIG. 1. According to a curve 30, the for the magnetizable element 3 already reaches saturation at relatively small induction levels B, that is to say reversible permeability μrel already falls to 1 at these relatively small induction levels. In contrast, according to a curve 10 for the material of the coil core 1, the relative permeability μrel only falls to 1 at relatively large induction levels.

According to a further feature of invention, a pulsed current which is sufficient to drive the magnetizable element 3 to saturation is intermittently superimposed on the current which flows through the winding 2 of the coil 1, 2 and generates the magnetic field of the magnetic shield in the external space. If this is the case, then the saturated magnetizable element 3 can no longer close the magnetic circuit of the coil 1, 2, with the result that the field generated by the coil extends into the external space, which is to say the magnetic field pulse generator is open. On one hand, the coil core 1 and the winding 2 operate in the customary manner to generate the magnetic field extending into the external space, because the material of the coil core 1, according to the diagram of FIG. 3, only reaches saturation at relatively high induction levels in comparison with the material of the magnetizable element 3. On the other hand, the magnetizable element 3 is not saturated in the pauses in the intermittent pulsed current, with the result that the element closes the magnetic circuit of the coil 1, 2 and thus the magnetic field pulse generator is closed, which is to say no magnetic field acts in the external space.

Figure 2:
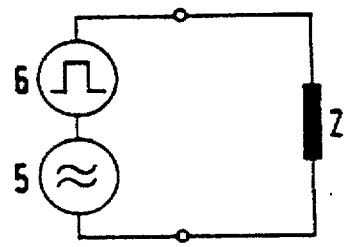
FIG. 2 is an equivalent schematic circuit diagram of a circuit for operating a magnetic field pulse generator according to FIG. 1.

FIG. 2 shows a schematic circuit diagram for electrically driving the winding 2 of the coil 1, 2 through the use of an AC source 5 which generates a steady-state magnetic field, and a pulse source 6 causing a current in the winding 2 which causes the magnetic field to be intermittently generated.

In order to provide the structure of the magnetic field pulse generator illustrated in FIG. 1 with constant cross-sectional area ratios for the magnetic flux, according to a development of the invention the magnetizable element 3 is provided with a conical structure on a side thereof facing the open side of the half-shell-type core coil 1, in such a way that the vertex of the cone lies in the center of the coil, with the half-shell-type core coil 1 being matched at its open side to the conical shape of the magnetizable element 3.

A magnetic shield of the type explained above can preferably be used in an inductive proximity switch.

I claim:

1. A magnetic field pulse generator, comprising:
    an electrical coil having a core formed of a material;
    a magnetizable element inductively coupled to said electrical coil, said magnetizable element formed of a ferromagnetic material reaching saturation at a magnetic induction small in relation to an induction necessary to saturate said material of said core;
    said magnetizable element and said electrical coil together radiating a magnetic field into an external space, the magnetic field in the external space being switched on and off by electrically switching over said magnetizable element from an unsaturated to a saturated state; and
    pulse voltage source coupled to said coil for superimposing a pulsed current on a current generating the magnetic field, the pulsed current being sufficient to generate a magnetic induction at which said magnetizable element reaches saturation.

2. The magnetic field pulse generator according to claim 1, wherein said coil has an open side, said core of said coil is a half-shell-type core, and said magnetizable element is placed onto said open side of and closes off said coil.

3. The magnetic field pulse generator according to claim 2, wherein said coil has a center, said magnetizable element has a side facing said open side of said coil, said side of said magnetizable element has a conical shape with a vertex lying in said center of said coil, and said open side of said coil is matched to said conical shape of said magnetizable element.

4. The magnetic field pulse generator according to claim 1, including an electrically conductive, metallic carrier housing into which said electrical coil and said magnetizable element fit flush.

5. A magnetic field pulse generator for an inductive proximity switch, comprising:
    an electrical coil having a core formed of a material;
    a magnetizable element inductively coupled to said electrical coil, said magnetizable element formed of a ferromagnetic material reaching saturation at a magnetic induction small in relation to an induction necessary to saturate said material of said core;
    said magnetizable element and said electrical coil together radiating a magnetic field into an external space, the magnetic field in the external space being switched on and off by electrically switching over said magnetizable element from an unsaturated to a saturated state; and
    a pulse voltage source coupled to said coil for superimposing a pulsed current on a current generating the magnetic field, the pulsed current being sufficient to generate a magnetic induction at which said magnetizable element reaches saturation.

* * * * *

UNITED STATES PATENT AND TRADEMARK OFFICE
CERTIFICATE OF CORRECTION

PATENT NO. : 5,705,861
DATED : January 6, 1998
INVENTOR(S) : Mauricio Esquerra

It is certified that error appears in the above-identified patent and that said Letters Patent is hereby corrected as shown below:

Title page, Item [30] should read as follows:

June 18, 1993 [DE] Germany ......... P43 20 250.0

Signed and Sealed this

Seventh Day of April, 1998

Attest:

BRUCE LEHMAN

Attesting Officer     Commissioner of Patents and Trademarks